United States Patent [19]

Davis et al.

[11] 4,320,334
[45] Mar. 16, 1982

[54] BATTERY STATE-OF-CHARGE INDICATOR

[75] Inventors: Richard K. Davis, Charlottesville; Charles E. Konrad, Roanoke, both of Va.

[73] Assignee: General Electric Company, Salem, Va.

[21] Appl. No.: 192,882

[22] Filed: Oct. 1, 1980

[51] Int. Cl.³ .......................... H02J 7/00; G08B 21/00
[52] U.S. Cl. ...................... 320/48; 324/433; 340/636
[58] Field of Search .............. 320/39, 40, 48; 340/636; 324/433

[56] References Cited
U.S. PATENT DOCUMENTS 3,932,797  1/1976  York ...................................... 320/48
4,021,718  5/1977  Konrad ................................. 320/48
4,234,840  11/1980 Konrad et al. ........................ 320/48

Primary Examiner—Robert J. Hickey
Attorney, Agent, or Firm—James H. Beusse; Arnold E. Renner

[57] ABSTRACT

Apparatus for providing a continuous indication of battery state-of-charge under load in a system in which the battery is subject to varying load conditions. The apparatus stores a value representative of battery open circuit terminal voltage and reduces the stored value while the battery is loaded at a rate proportional to the difference between the stored value and a scaled value of actual battery terminal voltage. If the scaled value exceeds the stored value, the stored value is increased to a value corresponding to the scaled value.

10 Claims, 2 Drawing Figures

BATTERY STATE-OF-CHARGE INDICATOR

BACKGROUND OF THE INVENTION

The present invention relates to battery monitoring apparatus and more particularly to a battery state-of-charge indication system.

Storage batteries are used in numerous applications where it is important to know the amount of available energy remaining in the battery. For example, the battery state-of-charge is a critical parameter in the operation of battery energized electrically propelled traction vehicles, such as electric cars and forklift trucks. Such vehicles must rely upon the energy stored in the on-board batteries for propulsion, and the replenishing of stored energy requires special equipment which is only available at a charging station. Thus, means for indicating the energy state of the remaining battery charge can be advantageously used by the vehicle operator to ensure that the vehicle is returned to a charging station before the battery has been completely discharged. The vehicle batteries represent a substantial investment and the amortization of battery costs depends upon the available number of charge/discharge cycles and upon the average depth of discharge of a lead acid battery. It is well known that the life of a battery is reduced significantly when it is repeatedly discharged such that the specific gravity of the electrolyte falls below a specified quantity. Hence, it is desirable to provide some means for recognizing that the battery state-of-charge is approaching this level. Further, it is important that such a state-of-charge indicator system provide a continuous and accurate state-of-charge output while the battery is connected to its normal load circuit and is operating under normal load conditions. For example, in the case of a battery energized vehicle, this permits the operator to perform his mission until the batteries have been discharged to a desired level.

Various types of prior art systems have been proposed for indicating the energy remaining in a battery or detecting a low battery condition under normal load operation including the following.

Specific gravity metering devices can detect a change in the index of refraction with variations in the specific gravity of the electrolyte. However, loads are commonly energized by plural batteries, each battery comprises a larger number of cells and the electrolyte condition varies from cell to cell. This requires multiple sensors to obtain an average specific gravity. This results in unduly complex sensing circuits and means for interconnecting the sensors to the indicating system so as to permit normal battery exchanges. Further, the specific gravity of a cell may vary throughout the cell so that no one location is ideal as a sensing point.

Ampere hour and watt hour meter devices operate on the assumption that the remaining available energy corresponds to the energy input during charging minus the electrical energy which has been extracted. However, such systems fail to account for loss in the remaining available energy resulting from increased current discharge rates. For example, ampere hour meters commonly utilize a reversible electrochemical plating cell. During battery charging, this cell is plated with a material at a rate corresponding to the magnitude of the charging current so that total plating is the product of current time. During discharge, the plating process is reversed in a similar fashion. However, the ampere hours (AH) available from a lead-acid battery depend upon the rate of discharge. Thus, a battery rated at 300 AH at a current drain which would deplete the charge in 6 hours may only provide 220 AH at a current corresponding to a one hour discharge rate so that the meter may indicate that one-third of the energy is available when, in fact, the battery is completely discharged. In addition, the instrument must remain with the batteries when batteries are exchanged for an alternate set at the charging station, since the meter cannot be reset for the unknown charging history of the new set. Further, such devices are subject to additional inaccuracies resulting from variations of recoverable AH based on battery age and temperature and variable battery charging efficiencies.

Arrangements have been proposed for indicating state-of-charge based on sensing the terminal voltage of batteries while energizing their load circuits. Commonly, a heavily damped voltmeter is connected directly across the battery to provide an indication of battery charge. The battery voltage varies substantially with the changes of discharge current encountered during operation of loads such as the electric motors of traction vehicles. Thus, the meter produces variable and erroneous indications of battery charge. An electric vehicle operator may judge the battery charge condition by the magnitude of voltage drop during a specific maneuver such as acceleration, i.e., a specific load. This requires a high level of skill and close observation by an operator who is likely to be preoccupied with vehicular operation.

Battery condition monitors utilizing a similar voltage detection principle have been employed in some battery powered industrial trucks. These devices have a voltage level switch activated when the battery terminal voltage drops below a preset level, e.g., 80–85% of nominal voltage. If the voltage remains below this level for a preset time interval, e.g. 15–30 seconds, an indicating lamp is energized and a second timer may be started. Upon the presence of the undervoltage condition over this second time interval, a specified work function of the vehicle, such as the forklift, can thus be disabled so as to force the operator to return to the charging station. However, the sensing and detection means of such monitors are inexact and dependent upon many variables, including the changes in battery voltage with variations in load. In addition, no continuous indicating means is available to continuously advise the operator of the present state-of-charge and the low charge indication will often catch the operator by surprise.

Battery state-of-charge indicating systems relying on detection of battery terminal voltage only during periods of load, i.e., only when subject to discharge current, have tended to be inaccurate. Improved results have resulted from a battery monitoring system providing an indication of the state-of-charge based on the differences between nominal battery voltage of a fully charged battery at a predetermined discharge current and the actual battery voltage occurring at the same predetermined discharge current level. A measure of battery voltage is stored when the predetermined value of discharge current occurs such that the stored value is updated solely during the occurrence of such predetermined value. Thus, the stored value provides a continuous indication of battery state-of-charge. This battery monitoring apparatus which is disclosed in U.S. Pat. No. 4,021,718, assigned to the assignee of the subject application, utilizes discharge current measuring means to produce a signal proportional to load, or discharge current. However, if such a current measuring device is not otherwise required for control of the battery load circuit, its requirement solely for use in battery state-of-charge monitoring increases the cost of the battery monitoring system which may limit its use in a highly competitive market.

An improved battery state-of-charge indicator is disclosed in our co-pending U.S. patent application Ser. No. 29,941 filed Apr. 13, 1979, now U.S. Pat. No. 4,234,840, and assigned to the assignee of the present invention. In that application we disclose a system for monitoring battery voltage and for storing a scaled value representative of battery terminal voltage. The stored value of terminal voltage is decreased at a predetermined rate which is independent of actual battery discharge current. When the scaled value of actual battery terminal voltage exceeds the stored value, the stored value is increased to the scaled value at a rate substantially faster than the predetermined discharge rate such that the stored value is indicative of battery voltage under no-load conditions and represents the battery state of charge. The stored value is decreased at a predetermined low rate when the battery is under load and is decreased at a faster rate under no load conditions. The faster rate can be varied as a function of the difference between the scaled value of actual battery voltage and the stored value.

Although this last described system provides an adequate representation of battery state-of-charge when the battery experiences frequent intervals of no-load conditions, this system is not totally accurate when the battery is subject to long periods of variable current drain with infrequent no-load conditions.

OBJECT OF THE INVENTION

It is, therefore, an object of the invention to provide an improved method and apparatus for reliably providing the state-of-charge of a battery while energizing its load, including during intervals of varying discharge current.

It is further object of the invention to provide such an improved method and apparatus which is operable without requiring sensing of discharge current magnitude.

It is another object of the invention to provide such apparatus for automatically providing a continuous state-of-charge indication substantially free of erratic indications or fluctuations caused by variations of discharge current.

SUMMARY OF THE INVENTION

The above and other objects are attained in accordance with the present invention by storing a scaled value representative of open circuit battery terminal voltage and modifying the stored value while the battery is under load by reducing the stored value at a rate proportional to the difference between the stored value and the scaled value of actual terminal voltage. If the scaled value exceeds the stored value, the stored value is increased at a fast rate until it becomes equal.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings, in which:

DETAILED DESCRIPTION

Figure 1:
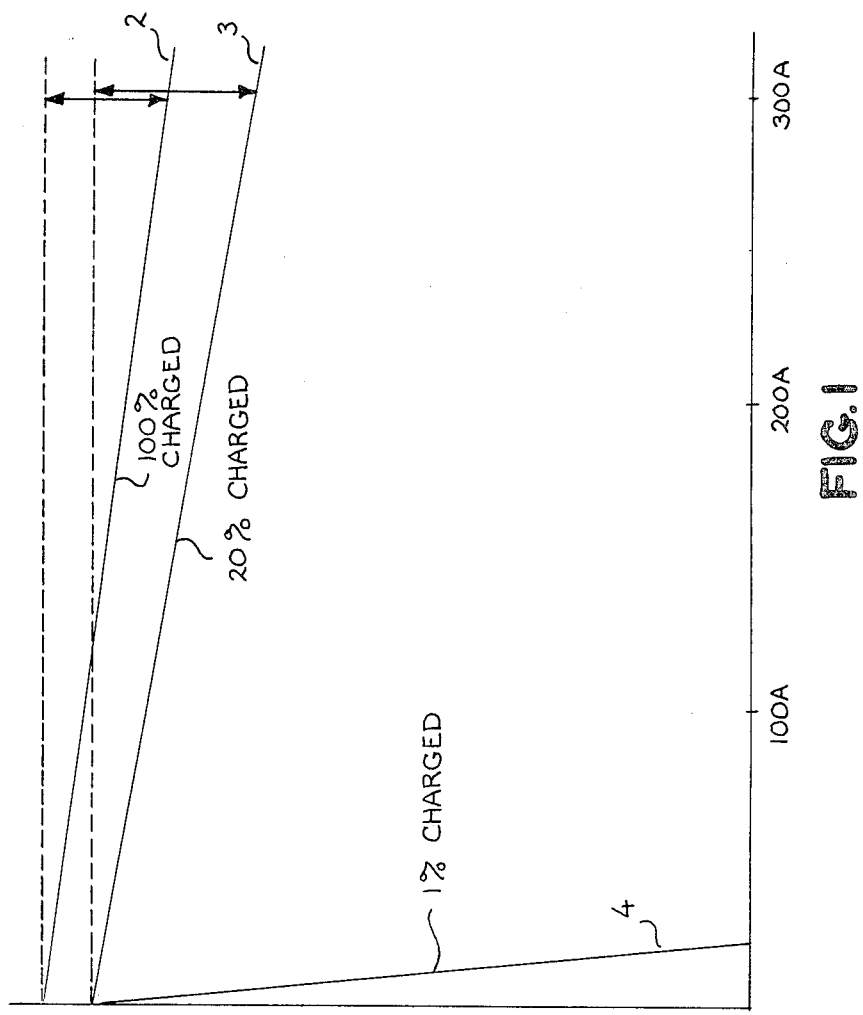
FIG. 1 is a representation of the relationship of battery terminal voltage and battery current at different levels of battery charge.

It is known that the terminal voltage of a lead acid storage battery which has been in a quiescent state for an extended period of time is a good indicator of the state-of-charge, for example, ranging from 2.12 volts per cell when fully charged to 1.97 volts per cell when substantially discharged. Thus, the state-of-charge of a battery which has been disconnected from its load for a suitable period of time may be detected such as by a suppressed zero volt meter. However, battery terminal voltage drops substantially under load, i.e., during the existence of discharge current, to a value which is representative of the magnitude of discharge current but not necessarily representative of battery state-of-charge. Further, after the discharge current terminates, the battery voltage rises only gradually to its true open circuit voltage. Thus, measuring the voltage of batteries under open circuit conditions is not a practical solution to state-of-charge indication for batteries which operate under varying load conditions with infrequent intervals of no-load or open-circuit conditions. FIG. 1 illustrates the relationship between battery terminal voltage and battery current for different initial states of battery charge of a typical lead-acid battery. The typical voltages for a fully charged, i.e., 100% charged, battery are 12.55 volts at zero current, 11.73 volts at 100 amperes, and 11.15 volts at 200 amperes. At 80% discharged, i.e., 20% charged, open-circuit or no-load battery terminal voltage drops to 11.82 volts with a proportional drop in terminal voltage under load. These voltage-ampere measurements are shown in FIG. 1 with a voltage-ampere characteristic line 2 for the fully charged battery and a voltage-ampere characteristic line 3 for a substantially discharged battery. The characteristic lines demonstrate the inverse voltage-to-current relationship existing at a specified level of charge, e.g., fully charged and discharged. Over the normal current operating range the load lines for a charged or discharged battery are approximately linear and have relatively similar slopes. The fully charged battery has a detectably higher no-load voltage than the discharged battery. Accordingly, the state-of-charge of the battery is determinable from the battery terminal voltage existing at a specified load current level within the range normally encountered during operation including at zero current.

Characteristic line 3 in FIG. 1 represents an 80% discharge state for a lead-acid battery, i.e., a battery having only 20% charge remaining. As is well known in the industry, such a battery state is considered to be fully discharged since any further discharge will significantly effect the life of the battery, i.e., the number of charge-discharge cycles that the battery can sustain. However, also shown on the graph of FIG. 1 is a characteristic line 4 representing a battery 99% discharged. Quite clearly, the terminal voltage drops very rapidly as load is applied from approximately 11.5 volts at no load toward zero volts along a characteristic line which, if extended, would cross the zero volt axis at about 25 amperes. Although the battery is still capable of generating current when discharged to such a low value, for the reason stated above, the normal operating range is above the 20% charge level.

Even though open circuit terminal voltage is recognized as a satisfactory way of determining battery state-of-charge under stable no-load conditions, that method is not very practical in a dynamic application since it is more important to have an indication of state-of-charge when the battery is in use. Furthermore, because of the relatively long time, e.g., 10 to 15 minutes, required for a battery to recover to its actual charge state when a load is removed, many applications will occur in which the battery will become discharged before being unloaded for a sufficient recovery time.

The present invention maintains an estimate of open-circuit battery terminal voltage by modifying the previous measurement of battery voltage by an amount proportional to the difference between the measured terminal voltage underload and the current estimated open circuit terminal voltage. The invention thus utilizes the relationship shown in FIG. 1, i.e., the magnitude of terminal voltage drop is a direct function of the magnitude of current being supplied by the battery.

Figure 2:
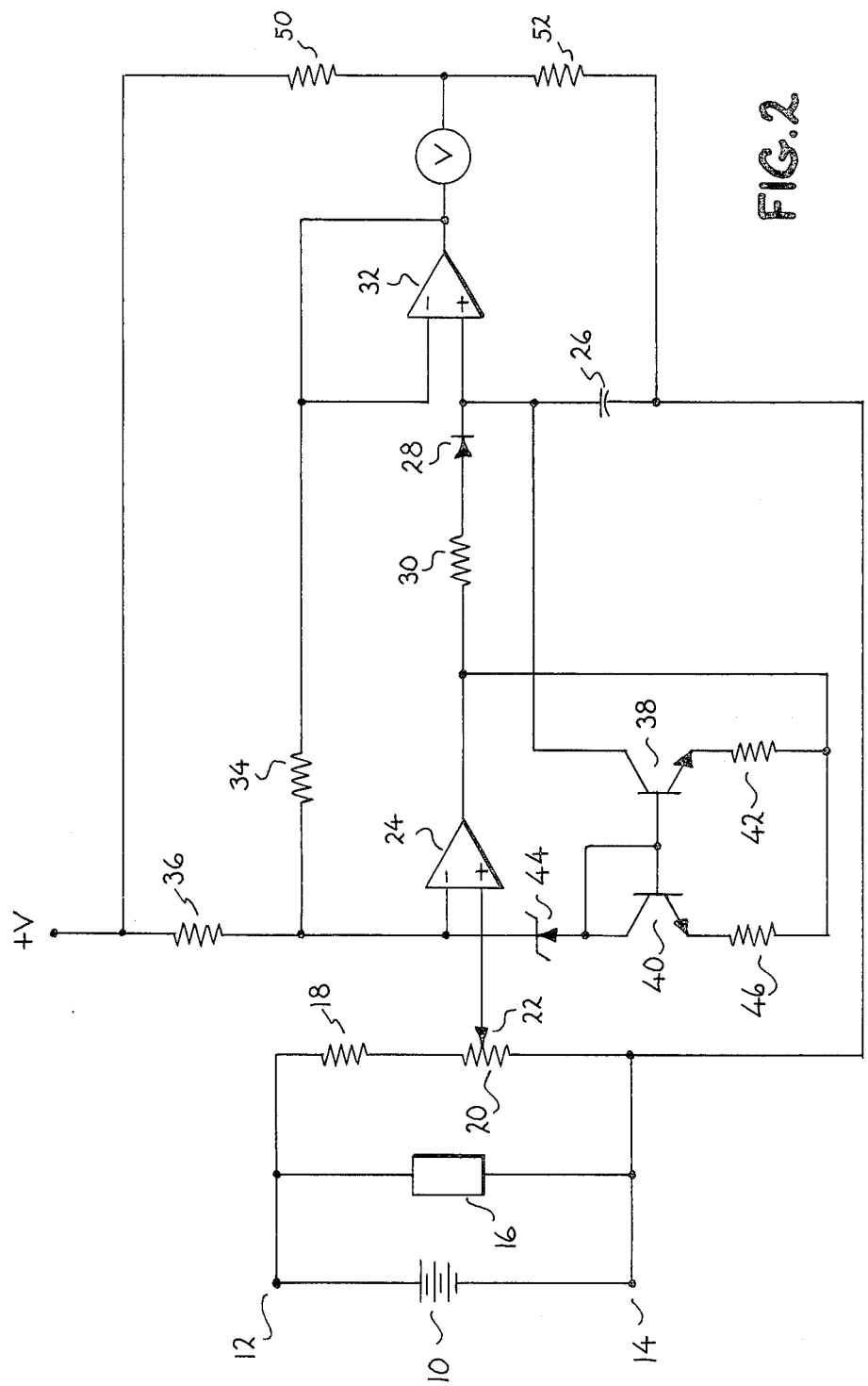
FIG. 2 is a simplified schematic drawing of a preferred embodiment of the present invention.

Referring now to FIG. 2 there is shown a simplified schematic diagram of a preferred form of the present invention. A battery 10 having terminals 12 and 14 is connected in series circuit arrangement with its normal load 16. A voltage sensor comprising the series combination of a resistor 18 and a potentiometer 20 is connected between the battery terminals 12 and 14 for providing a scaled battery terminal voltage signal. The scaled battery terminal voltage signal is developed on a moveable tap 22 of the potentiometer 20. The tap 22 is connected to a non-inverting input terminal of a comparator 24 which may be, for example, a type TL-082 amplifier available from Texas Instruments, Inc. The tap 22 is adjusted to provide a first predetermined voltage, e.g., 9 volts, when the battery is fully charged and will therefore provide a second predetermined voltage, e.g., 8.33 volts, when the battery is discharged to a 20% charge state. A capacitor 26 has one terminal connected to the battery terminal 14 and a second terminal connected via a diode 28 and a resistor 30 to an output terminal of comparator 24. The second terminal of capacitor 26 is also connected to a non-inverting input terminal of an amplifier 32 which may be, for example, a type LM-239 available from National Semiconductor, Inc. An output terminal of amplifier 32 is connected in a feedback loop to its own inverting input terminal so that the amplifier 32 functions as a voltage follower to provide at its output terminal a signal representative of the magnitude of charge on capacitor 26 without materially affecting that charge.

The output terminal of amplifier 32 is also connected via a resistor 34 to an inverting input terminal of comparator 24. This inverting input terminal is additionally connected through a resistor 36 to a regulated reference voltage source +V which may be, for example, +9 volts. The comparator 24 thus functions to compare the scaled voltage from tap 22 with a scaled voltage representative of the charge on capacitor 26. If the voltage at the junction of resistors 34 and 36 is less than the voltage on tap 22, the error voltage developed at the output terminal of comparator 24 forces current through resistor 30 and diode 28 to charge capacitor 26 to a higher voltage. The rate at which capacitor 26 is charged can be adjusted by changing the value of resistor 30. Preferably, the resistor 30 is chosen so as to provide an RC time constant of several minutes duration so that the voltage on capacitor 26 is not effected by short term transients.

Once the voltage on capacitor 26 rises such that the scaled voltage at the junction of resistors 34 and 36 exceeds the voltage on tap 22, the error voltage at the output terminal of comparator 24 drops to a level insufficiently high to force any further charging of capacitor 26. As battery voltage begins to drop under load, the error voltage at the output terminal of comparator 24 increases in a relatively negative direction. However, diode 28, with its cathode terminal connected to capacitor 26, prevents capacitor 26 from discharging into comparator 24. Consequently, the circuit thus far described constitutes a peak detector for charging capacitor 26 to the highest detected battery voltage which is sustained for the required time constant.

In order to adjust the voltage on capacitor 26 to a value representing battery state-of-charge during loading, there is provided a current mirror circuit for reducing the charge on capacitor 26 at a rate proportional to the drop in battery terminal voltage. The current mirror circuit comprises a first NPN transistor 38 and a second NPN transistor 40, each transistor being connected together via their respective base terminals. Transistor 38 has a collector terminal connected to the junction intermediate capacitor 26 and diode 28 and its emitter terminal connected through an emitter resistor 42 to the output terminal of comparator 24. Transistor 40 has its collector terminal connected through a zener diode 44 to the inverting input terminal of comparator 24 and its emitter terminal connected through an emitter resistor 46 to the output terminal of comparator 24. The collector terminal of transistor 40 is also connected to the common junction of the base terminals of transistors 38 and 40.

The zener diode 44 is provided for scaling and will be ignored for the present discussion. When the battery terminal voltage drops due to loading, a relatively negative error signal is developed at the output terminal of comparator 24 which, combined with the relatively positive voltage at the inverting input terminal of comparator 24, biases transistor 40 into conduction. Current through transistor 40 generates an emitter-base voltage proportional to the logarithm of the current. Since the emitter resistors 42 and 46 are connected to a common point, the voltage on the base terminal of transistor 38 also forces that transistor into conduction. The voltage on capacitor 26 therefore begins to discharge through transistor 38. The ratio of the current through transistor 38 to the current through transistor 40, and hence the discharge rate of capacitor 26, can be adjusted by the relative values of the emitter resistors 42 and 46. The current through transistor 40 is proportional to the battery terminal voltage drop and thus the discharge rate of capacitor 26 is similarly proportional to the battery voltage drop. The charge remaining on capacitor 26 at any time is therefore the present estimate of the open circuit battery terminal voltage or available energy remaining in the battery 10.

As shown in FIG. 1, even though a battery becomes substantially discharged, the open circuit terminal voltage of a useful battery will only drop down to about 92% of its fully charged open circuit voltage. Consequently, if a 12 volt meter were set to read full scale, only the upper 8% of the meter scale would be used. However, by proper scaling, the meter can be set to read full scale for a fully charged battery and zero for an 80% discharged battery. Such meter arrangements are well known in the art and are commonly referred to as suppressed zero meter circuits. Referring again to FIG. 2, a meter 48 is shown connected to indicate the voltage on capacitor 26. One terminal of meter 48 is connected to the output terminal of amplifier 32 and another terminal is connected to a junction intermediate a pair of resistors 50 and 52 which are serially connected to the reference voltage source +V. If the circuit elements of FIG. 2 are selected such that, for example, 3 volts on capacitor 26 is indicative of a discharged battery, i.e., 20% charge remaining, then the resistors 50 and 52 are selected to bias the meter at 3 volts so that a reading of zero is attained at that level of capacitor charge. The input voltages to amplifier-comparator 24 are also preferably scaled such that a variation of 9.0 to 8.33 volts at the tap 22 will provide a full range variation of meter 48. The zener diode 44 is selected to have a breakover voltage of about 6 volts so as to absorb the differential between the capacitor 26 voltage and the tap 22 voltage.

Although the preferred embodiment of the present invention is illustrated in an analog implementation in FIG. 2, it will be apparent to those skilled in the art that a digital implementation is equally feasible. For example, the storage capacitor 26 could be replaced by a digital counter whose output could be read out directly in numerical values. Analog to digital conversion of the battery and reference voltages are also feasible. Alternatively, the error voltage developed by comparator 24 could control a variable frequency oscillator to provide clock signals to the aforementioned counter whose count could be adjusted by the oscillator at a rate proportional to the voltage error.

Accordingly, it will be apparent to those skilled in the art that the invention is not limited to the specific illustrated embodiment and the appended claims are intended to cover the full spirit and scope of the invention.

What is claimed is:

1. A method for providing a representation of the state-of-charge of a battery comprising the steps of:
   (a) sensing the value of terminal voltage of the battery;
   (b) storing a value representative of the open circuit terminal voltage of the battery; and,
   (c) decreasing the stored value representative of open circuit battery terminal voltage at a first rate which is proportional to the difference between the stored value and the sensed value of battery terminal voltage when the sensed value is less than the stored value.

2. The method of claim 1 and including the additional step of increasing the stored value to a value representative of battery terminal voltage at a second rate which is representative of the difference between the stored value and the sensed value when the sensed value of battery terminal voltage is greater than the stored value.

3. The method of claim 2 and including the additional step of providing a display device for visual observation of the stored value.

4. Apparatus for providing a representation of the state-of-charge of a battery comprising:
   (a) means connected for sensing the magnitude of terminal voltage of the battery and for developing a first signal representative thereof;
   (b) means connected for receiving and storing said first signal;
   (c) means for comparing said stored first signal to subsequently developed ones of said first signals and for generating a second signal representative of the difference therebetween;
   (d) means for reducing the value of said stored first signal at a first rate proportional to said second signal when said stored first signal is representative of a greater battery voltage magnitude than that represented by said subsequently developed first signals; and,
   (e) means for increasing the value of said stored first signal at a second rate proportional to said second signal when said subsequently developed first signals are representative to a battery voltage magnitude greater than that represented by said stored first signal.

5. The apparatus of claim 4 wherein said battery terminal voltage sensing means comprises a resistive voltage divider connected between relatively positive and negative terminals of the battery, at least one element of said voltage divider being a potentiometer wherein said first signal is developed at a variable tap of said potentiometer.

6. The apparatus of claim 5 wherein said storing means comprises a capacitor.

7. The apparatus of claim 6 wherein said comparing means comprises a comparator amplifier having a first input terminal connected for receiving said first signal and an output terminal connected in a circuit for charging said capacitor, a second input terminal of said comparator amplifier being connected for monitoring the voltage on said capacitor through a scaling network.

8. The apparatus of claim 7 wherein said circuit connecting said output terminal of said comparator amplifier to said capacitor comprises a resistor and a diode serially connected between said comparator amplifier and said capacitor.

9. The apparatus of claim 8 wherein said means for reducing the value of said stored signal comprises first and second transistors connected in a current mirror circuit, said first transistor having a collector terminal connected to the junction intermediate said diode and capacitor and an emitter terminal connected through an emitter resistor to said output terminal of said comparator amplifier, said second transistor having a collector terminal connected to said second input terminal of said comparator amplifier and an emitter terminal connected through an emitter resistor to said output terminal of said comparator amplifier, a base terminal of each of said first and second transistors being connected to said collector terminal of said second transistor.

10. The apparatus of claim 9 wherein said rate for reducing the value of said stored first signal is adjusted by varying the relative values of said emitter resistors.

* * * * *